US009361181B2

(12) United States Patent
Laurent et al.

(10) Patent No.: US 9,361,181 B2
(45) Date of Patent: Jun. 7, 2016

(54) ERROR PROTECTION FOR MEMORY DEVICES

(75) Inventors: Christophe Laurent, Agrate Brianza (IT); Paolo Amato, Pagazzano (IT); Richard Fackenthal, Carmichael, CA (US)

(73) Assignee: Micron Technology, Inc., Boise, ID (US)

(*) Notice: Subject to any disclaimer, the term of this patent is extended or adjusted under 35 U.S.C. 154(b) by 149 days.

(21) Appl. No.: 13/421,578

(22) Filed: Mar. 15, 2012

(65) Prior Publication Data

US 2013/0246895 A1    Sep. 19, 2013

(51) Int. Cl.
| | |
|---|---|
| G11C 29/00 | (2006.01) |
| G11C 11/34 | (2006.01) |
| G11C 16/04 | (2006.01) |
| G06F 11/10 | (2006.01) |
| G11C 11/56 | (2006.01) |
| G11C 16/10 | (2006.01) |
| H03M 13/19 | (2006.01) |
| G11C 29/04 | (2006.01) |

(52) U.S. Cl.
CPC ........ *G06F 11/1072* (2013.01); *G06F 11/1012* (2013.01); *G11C 11/56* (2013.01); *G11C 11/5635* (2013.01); *G11C 16/107* (2013.01); G11C 2029/0411 (2013.01); G11C 2211/5641 (2013.01); *H03M 13/19* (2013.01)

(58) Field of Classification Search
CPC ........... G11C 11/5621; G11C 11/5628; G11C 11/5635; G11C 16/102; G11C 16/107; G11C 16/14; G11C 16/16; G11C 29/40; G11C 29/42; G11C 2211/5641; G11C 2211/5642; G06F 12/0238; G06F 12/0246; G06F 11/1072; G06F 11/1048; G06F 11/1068
USPC ................. 714/805, 800, 766, 767, 763, 752; 365/185.29, 185.24, 185.33, 185.09
See application file for complete search history.

(56) References Cited

U.S. PATENT DOCUMENTS

| | | | |
|---|---|---|---|
| 7,978,529 B1 | 7/2011 | Compagno | |
| 8,332,727 B2 | 12/2012 | Kim et al. | |
| 8,547,743 B2 * | 10/2013 | Ulriksson et al. | ........ 365/185.17 |
| 8,645,773 B2 * | 2/2014 | Goss et al. | ........ 714/718 |
| 8,719,665 B2 | 5/2014 | Roohparvar et al. | |

(Continued)

FOREIGN PATENT DOCUMENTS

| | | |
|---|---|---|
| KR | 10-0827662 B1 | 5/2008 |
| KR | 10-2010-0012874 A | 2/2010 |

(Continued)

OTHER PUBLICATIONS

International Search Report and Written Opinion dated Jun. 25, 2013 in corresponding PCT Application No. PCT/US2013/028368.

(Continued)

*Primary Examiner* — Christine Tu
(74) *Attorney, Agent, or Firm* — Brooks, Cameron & Huebsch, PLLC (57) ABSTRACT

Subject matter disclosed herein relates to methods and/or apparatuses, such as an apparatus that includes first and second groups of memory cells. The first group of memory cells stores multiple digits of program data per memory cell. The second group of memory cells stores a parity symbol per memory cell. Other apparatuses and/or methods are disclosed.

13 Claims, 5 Drawing Sheets

(56) References Cited

U.S. PATENT DOCUMENTS

| | | |
|---|---|---|
| 2007/0124653 A1 | 5/2007 | Conti et al. |
| 2008/0168215 A1 | 7/2008 | Jiang et al. |
| 2008/0313493 A1 | 12/2008 | Roohparvar et al. |
| 2008/0320366 A1* | 12/2008 | Lin ............................. 714/763 |
| 2010/0070827 A1 | 3/2010 | Kim et al. |
| 2010/0169741 A1 | 7/2010 | Laurent et al. |
| 2010/0211556 A1 | 8/2010 | Weingarten |
| 2010/0229035 A1 | 9/2010 | Kohler et al. |
| 2010/0257428 A1 | 10/2010 | Murin |
| 2010/0269016 A1 | 10/2010 | Ware |
| 2010/0269017 A1 | 10/2010 | Bueb |
| 2011/0066922 A1 | 3/2011 | Wezelenburg et al. |
| 2012/0127807 A1 | 5/2012 | Pio |
| 2014/0013033 A1* | 1/2014 | Sharon et al. ................. 711/103 |

FOREIGN PATENT DOCUMENTS

| | | |
|---|---|---|
| KR | 10-2010-0031403 A | 3/2010 |
| WO | 2011161622 A1 | 12/2011 |

OTHER PUBLICATIONS

Korean Office Action, and its English translation, dated Jul. 21, 2015 in corresponding Korean Patent Application No. 10-2014-7027842.
Second Notice of Preliminary Rejection from related Korean patent application No. 10-2014-7027842, dated Jan. 19, 2016, 18 pp.
Supplementary European Search Report from related European application No. 13761023.4, dated Oct. 9, 2015, 7 pp.

\* cited by examiner

ERROR PROTECTION FOR MEMORY DEVICES

BACKGROUND

1. Field

Subject matter disclosed herein relates to error protection for memory devices.

2. Information

Memory devices may be used in various electronic devices, such as computers, cell phones, personal digital assistants (PDA's), data loggers, or navigational equipment, just to name a few examples. For example, various types of nonvolatile memory devices may be used, such as NAND flash memory or NOR flash memory, just to name a few examples. It would be desirable if error protection could be provided for memory devices.

DETAILED DESCRIPTION

Reference throughout this specification to "one embodiment" or "an embodiment" means that a particular feature, structure, and/or characteristic described in connection with an embodiment is included in at least one embodiment of claimed subject matter. Thus, appearances of phrases such as "in one embodiment" or "an embodiment" in various places throughout this specification are not necessarily all referring to the same embodiment. Furthermore, particular features, structures, and/or characteristics may be combined in one or more embodiments.

Embodiments of claimed subject matter may include methods and/or apparatuses (e.g., an individual apparatus or a combination of apparatuses or components thereof) for performing operations. An apparatus may be specially constructed for desired purposes and/or an apparatus may comprise a general-purpose computing device capable of operating in accordance with a computer program stored in memory. A program may be stored in memory, such as, but not limited to, any type of disk including floppy disks, optical disks, compact disc read only memories (CD-ROMs), magnetic-optical disks, read-only memories (ROMs), random access memories (RAMs), nonvolatile memories such as electrically programmable read-only memories (EPROMs), electrically erasable and programmable read only memories (EEPROMs) and/or FLASH memories, phase change memories (PCM) and/or any other type of media suitable for storing electronic instructions.

A memory typically may comprise a non-transitory device. In this context, a non-transitory memory may include a device that is tangible, meaning that the device has a concrete physical form, although the device may change one or more of its physical states. Thus, for example, non-transitory refers to a device remaining tangible despite a change in state.

In describing embodiments of claimed subject matter, the term "bit" corresponds to a binary digit of data, such as represented by a state of a binary digital data signal, which is sometimes also referred to as a logic signal, a binary signal, a logic state, or a binary state. The value of a bit, a fraction of a bit, or multiple bits may be stored by programming (e.g., writing) a memory cell, such as a single transistor, for example, to one of a plurality of data states. For example, in a single level memory cell (SLC or SLC cell), the cell might be programmed to a first (e.g., logic 1) data state or a second (e.g., logic 0) data state. Additionally, multiple binary digital data signals and/or multiple data states comprising individual binary digital data signals and/or data states may be organized and/or aggregated to construct (e.g., assemble) a "symbol," which may collectively represent, for example, two bits, four bits, eight bits, 10 bits, and so forth. In one example, a 2-bit symbol may have a binary value of 00, 01, 10, or 11. In some cases, a single memory cell may be selectively programmed to a respective data state representing any one of those values. For example, a 00 value for a 2-bit symbol may be stored by programming a memory cell to a respective one of four possible data states (e.g., corresponding to a respective range of threshold voltage levels). In a similar manner, a particular value of a 4-bit symbol (e.g., 0101) may be stored by programming one or more memory cells to a respective one of 16 possible data states, and a particular value of an 8-bit symbol (e.g., 0000 0110) may be stored by programming one or more memory cells to a respective one of 256 different data states, and so forth. Any of the foregoing symbols may be communicated as one or more measurable physical properties (e.g., an acoustic, current, radiation, and/or voltage level) of, for example, one or more data signals.

Further, a "codeword" may be stored as respective programmed data states of multiple memory cells (e.g., perhaps as many as 200 or more) representing program data (e.g., stored information or information to be stored), along with, for example, respective programmed data states of multiple memory cell states representing parity data, the latter which may be used to detect and/or correct errors in the program data that may have potentially been introduced through various mechanisms. Parity data may also be referred to as error protection data. Embodiments of claimed subject matter may include an erasure flag that indicates that location(s) of one or more errors within a codeword are known and/or may be approximated. In the event that location(s) of one or more errors within a codeword are known or may be approximated, certain error protection codes (such as, for example, a Reed Solomon error protection code) may be capable of correcting perhaps as many as twice the number of errors that could be corrected if the location(s) of the one or more errors was or were otherwise unknown (although nothing herein should be interpreted as requiring or limiting embodiments of claimed subject matter to a particular coding technique). In this context, an error protection code refers to a code employed to detect and/or correct errors (ECC). In this context, a codeword in connection with an error protection code may comprise programmed data states within memory representing program data and parity data.

Memory may be employed in a variety of contexts. As an example, memory may be included in a computing system. In this context, the term computing system refers to at least a processor and memory coupled by a bus. Likewise, in this application, the terms memory, memory system, memory module, memory device and/or memory apparatus are used interchangeably unless the context of usage indicates otherwise. A memory cell, however, refers to a unit of storage within a memory and a memory array refers to an array of memory cells. Typically, memory cells of an array comprise a memory core. It is understood, however, that a memory, memory system, memory module, memory device and/or memory apparatus may also include other circuitry or components to enable use of the memory cells, for example. Likewise, a memory subsystem refers to a sub-portion of a memory system.

For some types of memory, a memory cell may toggle from a first data state (e.g., a "1" data state) to a second data state (e.g., a "0" data state) more easily than it may toggle from the second data state to the first data state. Such a memory cell may be called a "one-directional" memory cell. For example, a NOR or NAND flash memory cell in a "1" data state may toggle to a "0" data state relatively easily by adding electrical charge to a charge storage structure (e.g., a floating gate or a charge trap) of the memory cell. However, electrical charge may be relatively difficult to remove from a charge storage structure of a memory cell, making it more difficult to toggle back to the "0" data state from the "1" data state. Moreover, typically, a block of memory cells in a flash memory device are erased at substantially the same time to toggle cells in a "0" data state back to a "1" data state, referred to as a block erase or block erase operation. However, executing one or more block erases may comprise an undesirably slow process.

In an embodiment, a memory cell that may be programmed to one of more than two data states is often referred to as a multi-level memory cell (MLC or MLC cell). With a typical MLC cell, a particular value of N bits of data (where N is greater than 1) is represented by a respective one of M data states, where $M=2^N$. In such a case, the MLC cell may be used to store N bits of data. For example, as an example, a MLC cell may be programmed to one of four data states, where a first data state may represent a binary value of 11, a second data state may represent a binary value of 01, a third data state may represent a binary value of 10, and a fourth data state may represent a binary value of 00. Such a cell in an embodiment may transition from the first data state to the second data state, from the second data state to the third data state, and from the third data state to the fourth data state by successively adding electrical charge to a charge structure of the cell, and without necessarily erasing the cell. Accordingly, programming (e.g., writing) such a cell from the first data state to the first, second, or third data states, from the second data state to the third or fourth data states, or from the third data state to the fourth data state may be considered herein as "programming in an allowed direction." Meanwhile, since doing so would conventionally involve first erasing the cell, programming the cell between any other data states may be considered herein as "programming in a non-allowed direction" (as understood, this does not mean that the cell is not allowed to be programmed between such data states, but simple means that doing so involves first erasing the cell).

In an embodiment of this disclosure, instead of using a MLC cell to store N bits of data (again, where $M=2^N$), the cell may be programmed to one of M data states to represent a value of less than N bits of data. For example, such a cell may be programmed to one of four data states (with such a cell sometimes being referred to herein as a four-level MLC cell), where a first data state may represent a binary value of "1," a second data state may represent a binary value of "0," a third data state may also represent a binary value of "1," and a fourth data state may also represent a value of "0." A memory cell according to such an embodiment may thus transition from, for example, a "1" data state to a "0" data state, from the "0" data state to another "1" data state, and from the other "1" data state to another "0" data state by successively adding electrical charge to a charge structure of the cell, for example. Thus, a cell according such to an embodiment may toggle between bit values (e.g., "1" and "0") a particular number of times by adding electrical charge and without erasing the cell in this example.

In an embodiment disclosed herein, some MLC cells may be used in a multi-level fashion to store multiple digits (e.g., binary digits which are commonly referred to as "bits"), while other MLC cells may be used to store a single digit (e.g., a bit). The data stored may comprise, for example, parity data used to provide error protection for program data in a codeword, such as previously described, for example. According to such an embodiment, block erases may be reduced.

For example, providing error protection for a codeword may involve detecting and/or correcting errors associated with a codeword read from memory. For example, a Hamming code, such as Hamming(7,4), may be used to encode 4 bits of program data into 7 bits of encoded data by adding 3 bits of parity data to form codeword data, where a bit of parity data may operate to provide error protection for a respective three bits of the program data in this example.

Conventionally, a program (e.g., memory write) operation may toggle a bit stored in a memory cell without first erasing the cell as long as the programming is in an allowed direction. On the other hand, if a program operation is in a non-allowed direction, conventionally the cell first is erased (e.g., via a block erase) before the bit may be toggled. In comparison, a program operation in an allowed direction need not involve a block erase, which may otherwise be undesirably slow or delay program operations.

However, even if programming to toggle a bit of program data in a codeword may be in an allowed direction, such an operation may still involve programming a bit of parity data associated with the codeword in a non-allowed direction. Thus, while a block erase may not be required before toggling, changes in the parity data associated with the codeword may still call for a block erase. Although error protection could be "turned off" or otherwise disregarded to avoid such a block erase, doing so would mean that at least some error protection for the codeword may be undesirably lost.

Accordingly, embodiments described herein may involve techniques to provide memory devices with error protection while avoiding a block erase or by block erase operations taking place less frequently. Techniques may allow a digit of parity data to be programmed in a conventionally non-allowed direction without necessarily requiring a block erase. One technique may include generating parity data that maintains a number of parity data changes below a threshold before executing a block erase operation. In a possible embodiment, the parity data may be generated, at least in part, using a parity generator array that may be constructed in a manner so as to maintain a number of parity data changes below a threshold. For example, a single MLC cell of a first group of memory cells may be used to store a single bit of parity data in one embodiment. Meanwhile, a single MLC cell of a second group of memory cells may be used to store two or more bits of program data.

In one implementation, memory programming circuitry may, for example, store electrical charge in a charge storage structure of a MLC cell to change a bit of parity data (e.g., toggle the bit of parity data between a first value and a second value) multiple times before erasing the MLC cell. In an embodiment, the number of possible changes may correspond to a number of possible data states to which the MLC cell may be programmed. For example, if the MLC cell may be programmed to one of M (e.g., four) possible data states, it may be toggled up to M−1 (e.g., three, if M=4) times. Of course, these details of operating one or more memory cell(s) are merely examples, and claimed subject matter is not so limited.

As mentioned above, a flash memory device, such as a NAND or a NOR flash memory device, may include, for example, one or more MLC cells that may be used to store a single bit of parity data per cell instead of storing multiple bits per cell. A value of a single bit of data may comprise, for example, a "1" or a "0." In one possible embodiment, a MLC cell may include a transistor capable of being programmed such that its threshold voltage level is in one of a number (M) of distinct voltage ranges, the respective voltage ranges individually corresponding to a respective data state of the memory cell. Some of these data states may be distinguishable from one another in a process of detecting to which data state, representing parity data, in this example, among multiple possible data states, the memory cell is programmed. A write controller or a read controller may, for example, operate a memory device that accommodates storing a single bit of data in a MLC memory cell, for example, in one possible embodiment.

In one or more embodiments, codeword data, which includes program and data parity data, may be stored in an apparatus such as a memory device so that a stored bit of parity data may be capable of being changed more than once without first erasing a corresponding cell (or block) of the memory device storing the parity data. In one implementation, the codeword data may be stored in memory as groupings of bits in which parity data may be stored as bits of data associated with respective groupings of bits of program data. Thus, in an example, codeword data may be stored in memory as consistently sized groupings of bits of program and parity data. Parity data may, for example, be stored as a respective bit of data associated with a consistently sized grouping of bits of program data to form a codeword, or portion thereof, for example. A codeword may comprise, for example, 256 bits of program data stored as sixteen 16-bit words, in one example, in addition to parity data. Consistently sized groupings of bits, whether of program data or program and parity data together may, of course, comprise any number of bits, such as that of a byte, a word, multiple bytes, or multiple words, and claimed subject matter is not limited in this respect.

Sizes of groupings of bits of codeword data may affect the amount of memory allocated to storing parity data. For example, the amount of flash memory allocated to storing parity data (e.g., at least a portion of array overhead) may decrease on a percentage basis relative to that of codeword data as the average number of program data bits in the groupings of bits increases. For example, a percentage basis may comprise a ratio of a number of bits of parity data to an associated number of bits of codeword data.

As mentioned above, parity data may be generated to maintain a number of data state changes to be below a particular number before an erase operation, such as a block erase, is executed. As alluded to previously, a bit of parity data may be associated with program data at a level of granularity that includes multiple bits in one embodiment. For example, a bit of parity data may be associated with groupings of bits of program data, such as bytes, words, multiple bytes, or multiple words of program data. Groupings of bits may be consistently sized, in some examples. In other words, in some embodiments, a bit of parity data may be associated with program data on a per cell basis, a per byte basis, or a per word basis, just to name a few examples. However, in other embodiments, groupings need not be consistently sized necessarily.

Figure 1:
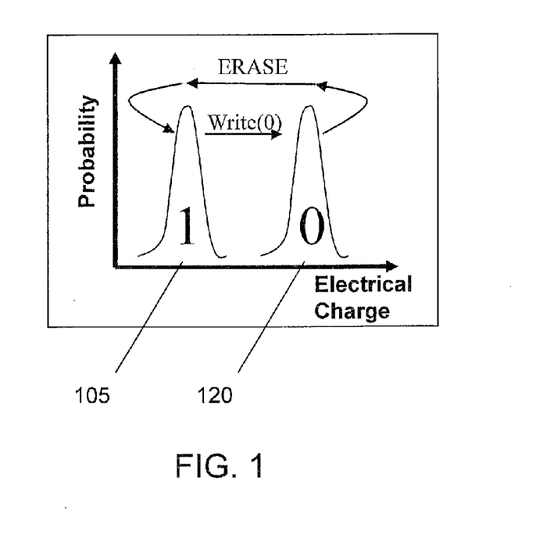
FIG. 1 is a schematic diagram of an embodiment of a program operation for a single-level memory cell (SLC).
Figure 2:
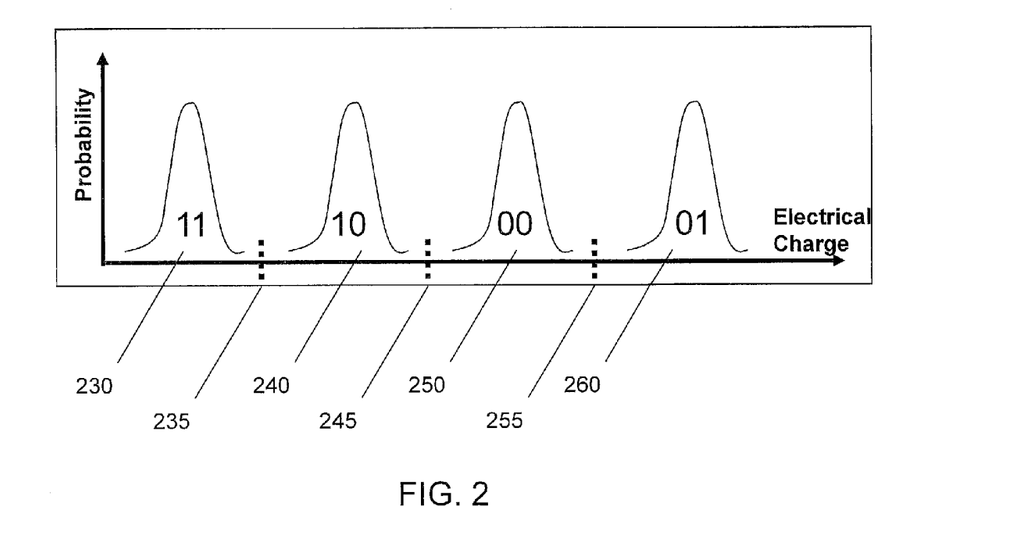
FIG. 2 is a schematic diagram illustrating states of a multilevel memory cell (MLC)

FIG. 1 is a schematic diagram of an embodiment of a program operation for a single-level memory cell (SLC or SLC cell). The horizontal axis may be used to describe an amount of electrical charge on a charge storage structure of a transistor of a memory cell and the vertical axis may be used to describe a magnitude of data state probability for the memory cell. For example, data state probability may express a probability that a memory cell is in one of two data states, such as a "1" data state or a "0" data state. Of course, other embodiments may involve any number of memory cell data states, and claimed subject matter is not limited in this respect. As an example, a charge storage structure of a memory cell, before any programming, may be at a charge level 105, which may correspond to a "1" data state. The memory cell may be transitioned (e.g., toggled) to a "0" data state by adding charge to the charge storage structure. For example, the charge storage structure of the memory cell may be charged to a charge level 120, which may correspond to a "0" data state. To further transition (e.g., toggle) a data state in a SLC cell, an erase operation, such as that comprising a block erasure, for example, may be employed. Unfortunately, erasure in a flash memory, for example, typically involves erasing a block of memory cells rather than a single memory cell and/or may be comparatively slower than other memory operations, such as programming a cell, for example. Of course, a "1" data state and a "0" data state need not correspond to the charge levels shown in FIG. 1, nor do the charge levels shown in FIG. 1 need to correspond to a "1" data state and a "0" data state, and claimed subject matter is not limited in this respect. This is merely an illustration A MLC cell may be programmed to one of more than two data states, as shown in FIG. 2, which is a schematic diagram of an embodiment of a MLC cell capable of storing two bits of data (e.g., binary values of 11, 10, 00, or 01), which is sometimes referred to herein as a four-level MLC cell. The horizontal axis may be used to describe an amount of charge on a charge storage structure of the memory cell and the vertical axis may be used to describe a magnitude of data state probability for the memory cell. Data state probability may express a probability that the memory cell is programmed to one of four data states, such as those corresponding to the binary values "11", "10", "00", and/or "01." Of course, other embodiments may involve any number of data states, and claimed subject matter is not so limited. This is merely an illustration As previously mentioned, a memory cell may include a transistor (not shown) that may be programmed to a threshold voltage within one of a number of ranges of voltage levels, where a range corresponds to a respective data state, e.g., 230, 240, 250, and 260, which in turn represents a respective value of more than one bit of data. For example, a first data state 230 may correspond to a voltage level below a first level 235. A second data state 240 may correspond to a voltage level between the first level and a second level 245. A third data state 250 may correspond to a voltage level between the second level and a third level 255, a fourth data state 260 may correspond to a voltage level above the third level, and so on. Individual data states may represent a respective value of two bits of data, such as "11" in the case of data state 230, "10" in the case of data state 240, "00" in the case of data state 250, or "01" in the case of data state 260, for example. Of course, data states need not correspond to the specific voltage ranges or represent the specific values shown in FIG. 2, and claimed subject matter is not limited in this respect. This is merely an illustration.

Figure 3:
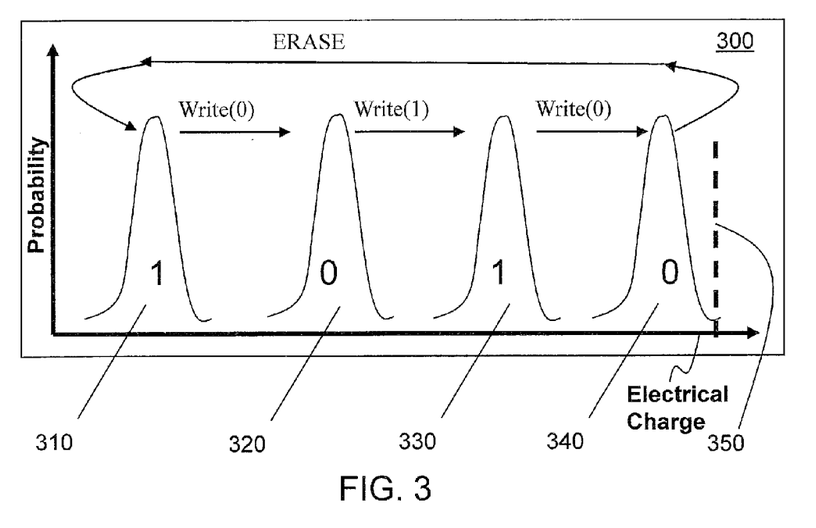
FIG. 3 is a schematic diagram illustrating states of another embodiment of a multilevel memory cell (MLC).
Figure 4:
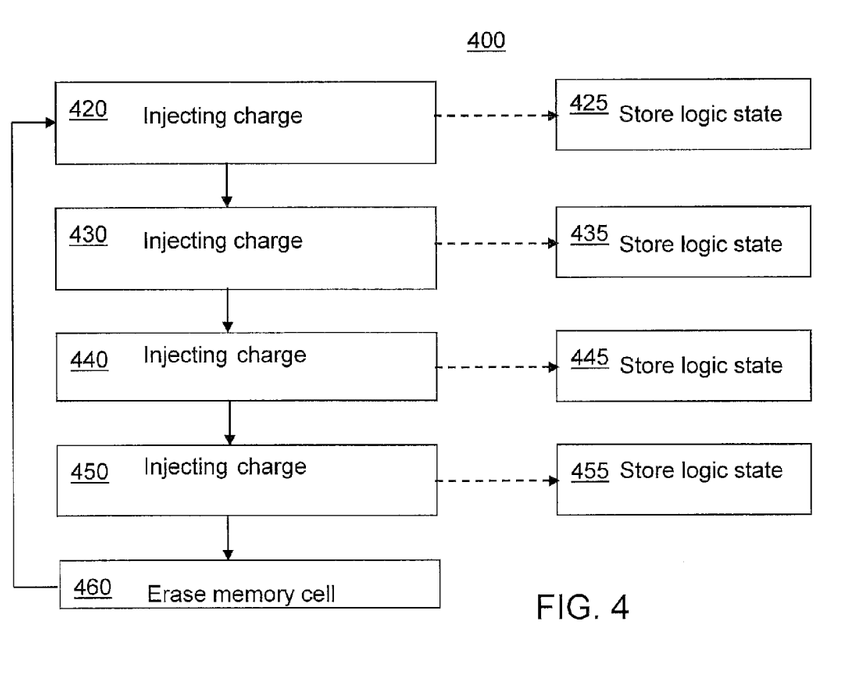
FIG. 4 is a flow diagram of an embodiment of a process to program a multilevel memory cell to a data state that represents a value of a single bit of data.

According to an embodiment, a MLC cell may be used to store a single bit of parity data, as shown in FIG. 3, which is a schematic view of an embodiment 300 of a number of ranges of voltage levels, where some ranges may represent a same value of a single bit of parity data stored in the cell, as illustrated in this example. FIG. 4 is a flow diagram of an embodiment of a process 400 to store a single bit of data in a MLC cell, such as that shown in FIG. 3. The horizontal axis in FIG. 3 may be used to describe an amount of charge on a charge storage structure of a memory cell and the vertical axis may be used to describe a magnitude of data state probability for the memory cell. Data states 310, 320, 330, and 340 may, for example, correspond to voltage levels in ranges of approximately 1.0 to 1.2 volts, 2.0 to 2.2 volts, 3.3 to 3.5 volts, and 4.8 to 5.0 volts, respectively. Of course, these voltage level ranges are merely examples, and claimed subject matter is not so limited. This is merely an illustration. A MLC cell may include any number of voltage level ranges, and claimed subject matter is not limited to four ranges.

According to an embodiment, a MLC cell may be programmed multiple times without erasing a charge storage structure. For example, in process 400, a memory cell may start with a charge storage structure at a charge level corresponding to a first data state 310 to store a bit of data having a binary value of "1," for example. This may, for example, in an implementation, correspond to having just executed an erase operation. In an implementation, thus, a memory cell may store a bit of data having a binary value of "1" as a result of the memory cell being erased (see, e.g., block 460). Of course, this is merely an illustrative embodiment and many other alternatives are possible and included within the scope of claimed subject matter.

Continuing with this example, a data state of a cell may be transitioned to store a bit having a binary value of "0" by adding (e.g., injecting) charge to the charge storage structure, as shown in blocks 430 and 435. As a result, the charge storage structure of the memory cell may be at a charge level (e.g., in a range) corresponding to a second data state 320, thereby storing a bit of data having a binary value of "0," for example. A data state of the memory cell may be transitioned again to store a bit having a binary value of "1" by adding additional charge to the charge storage structure, as shown in blocks 440 and 445. As a result, the charge storage structure of the memory cell may be at a charge level (e.g., in a range) corresponding to a third data state 330, storing a bit of data having a binary value of "1." A data state of the memory cell may be transitioned again to store a bit having a binary value of "0" by adding still additional charge to the charge storage structure, as shown in blocks 450 and 455. As a result, the charge storage structure of the memory cell may be at a charge level (e.g., in a range) corresponding to a fourth data state 340, storing a bit of data having a binary value of "0." According to the illustrated embodiment, to further transition the data state of the memory cell, an erase operation may be employed, as shown in block 460, returning a cell to an initial state after an erase operation, as previously described. Of course, details of a program or erase operation described above are merely examples of transitioning a data state of a memory cell, and claimed subject matter is not so limited.

Figure 5:
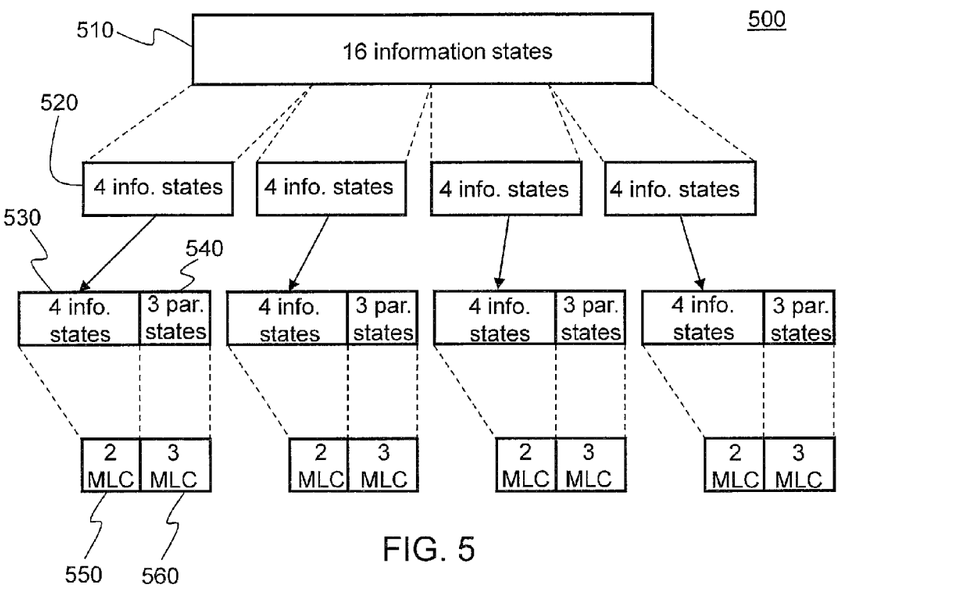
FIG. 5 is a schematic diagram of an embodiment of partitioning and/or associating program data with parity data.

FIG. 5 is a schematic diagram of an embodiment 500 associating program data with parity data in a codeword (e.g., employing an ECC or error protection code). Though a particular arrangement of data is shown, these are merely examples, and claimed subject matter is not limited to any particular numbers. As discussed above, parity data may provide error protection for program data written to memory. Parity data may comprise, for example, one or more bits that may be associated with particular program data of a codeword. A collection of bits, stored in memory cells by programming them to corresponding data states, may comprise codeword data that includes program data and associated parity data.

Returning to a previous example, a Hamming(7,4) Code may be used to encode four bits of program data into seven bits of encoded data of a codeword in this example, including 3 bits of parity data. To accommodate such a code, a word 510 of a codeword may be partitioned into groups 520 of 4 bits, in an embodiment. The four bits of program data in such a group 520 may be encoded into 7 bits of encoded data (e.g., four bits of program data 530 and three bits of associated parity data 540) in this example. Of course, other embodiments may involve other arrangements of ECC in which codeword data is formed from program data and associated with parity data, and claimed subject matter is not limited to any particular arrangement. For example, in one case, eleven bits of program data may be associated with four bits of parity data (e.g., Hamming(15,11), while in another case twenty-six bits of program data may be associated with five bits of parity data (e.g., Hamming(31,26). In these cases, partitioning of codeword data may be different from that shown in FIG. 5, for example.

Returning to embodiment 500, program data 530 may be stored in MLC cells in a multi-level manner. Storing program data in MLC cells in a multi-level manner allows a given amount of program data to be stored in fewer cells than if the same amount of program data were stored in SLC cells. Thus, capacity for storing program data may be increased. For example, four bits of program data may be stored in two MLC cells that are capable of being programmed to one of four data states. In other words, more than one bit of data may be stored in a single MLC cell. Meanwhile, in at least one embodiment, a single bit of parity data 540 may be stored in a single MLC cell. For example, a bit of parity data may be stored in a single MLC capable of being programmed to one of four data states. Storing a single bit of parity data in a single MLC cell may allow such a MLC cell to be programmed multiple times before a block erase operation is employed. Thus, the value of a bit of parity data stored in a single MLC cell may be changed multiple times.

A particular program operation carried out on MLCs 550 may result in stored program data changing without a block erase or with fewer block erase operations. Likewise, in accordance with an embodiment, MLC cells 560 storing bits of parity data associated with such stored program data may be reprogrammed as a result of changing the associated program data, but also without a block erase or with fewer block erase operations. In an embodiment, therefore, program operations may be carried out to accommodate parity data and/or program data changes without a block erase or with fewer block erase operations.

Among a number of possible techniques, parity data may be generated using a parity generator array, such as a matrix, which may be employed in a manner to permit parity data to change a particular number of times before an erase operation. For example, in an implementation, if parity data is stored in MLC cells that are capable of being programmed to one of four data states, a parity generator array may permit a bit of parity data to change three (e.g., four minus one) times, though claimed subject matter is not so limited.

Figure 6:
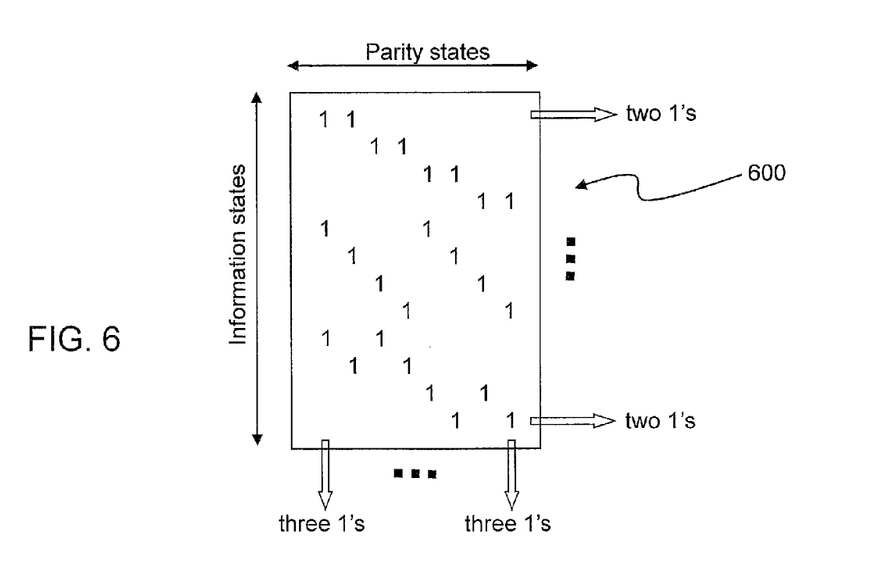
FIG. 6 is an embodiment of a parity generator array.

FIG. 6 is an embodiment of a parity generator array 600, such as a matrix. Array 600 may correspond to an implementation where MLC cells capable of being programmed to one of four data states may be used to store parity data. A Hamming(20,12) Code may be used to generate the parity data, though claimed subject matter is not so limited. A parity generator array may comprise one dimension equal representing a number of bits of program data and another dimension representing a number of bits of parity data. The arrangement shown in FIG. 6 is merely an example, and claimed subject matter is not so limited, of course.

Array 600 may comprise twelve rows and eight columns. In the array, "1"s may be represented by memory cells programmed to "1" data states and "0"s may be represented by memory cells programmed to "0" data states. A column of array 600 may correspond to a bit of parity data. A row of array 600 may correspond to a bit of program data. "1"s in a column and a row may form an association between a respective bit of program data and a respective bit of parity data. Thus, a location in array 600 may represent an association between a particular bit of program data and a particular bit of parity data.

Employing an array 600 such as that illustrated in FIG. 6, in an embodiment, may permit a bit of parity data to change three times, for example, before employing an erase operation, where the bit of parity data may be associated with three bits of program data in this particular example (e.g., for a MLC memory array including MLCs capable of being programmed to one of four data states). For example, as discussed previously, multi-level capability may be employed to permit change in a direction that otherwise is not allowed (e.g., involves employing an erase operation). Accordingly, in at least one possible embodiment, a column corresponding to a bit of parity data may include three "1"s.

Other numbers of "1"s may be included in rows and columns. In one implementation, for example, before generating parity data or a parity generator array, the number of data states to which a MLC cell is able to be programmed may be pre-stored or be selectable, such as with special purpose software, as an example. A processor may use this information, as one example, to generate an appropriate parity generator array.

Figure 7:
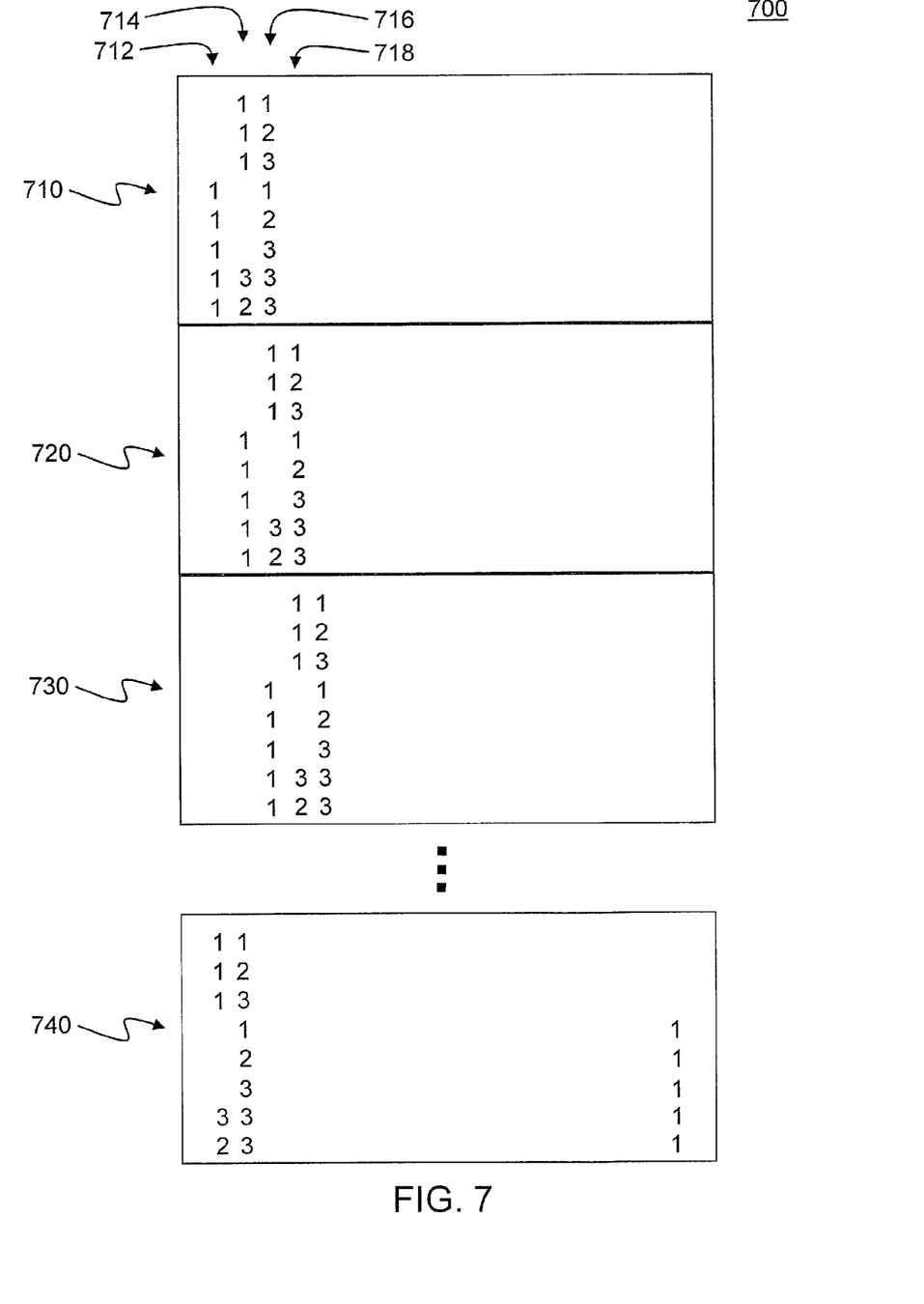
FIG. 7 is another embodiment of a parity generator array.

FIG. 7 is another embodiment of a parity generator array 700, such as a matrix. Array 700 may comprise another implementation, similar in at least some respects to the array 600 implementation. By analogy, a row of array 600 may correspond to a sub-array (e.g., 710, 720, 730, and so on) of array 700. Thus, a row in array 600 corresponds to a bit of program data, as just described; likewise, a sub-array in 700 corresponds to a word of program data. A column in array 600 includes three "1"'s; likewise, array 700 is arranged so that three sub-arrays have a corresponding non-zero column.

Previously, one bit parity was employed. Here, a parity symbol comprising two bits is employed. Thus, parity generator array 700 comprises an array including quaternary-valued states that correspond to MLCs that store four state levels, for example. That is, in this example, components in array 700 may comprise any one of four numbers: "0"; "1"; "2"; or "3". In FIG. 7, blank spaces in array 700 where no component is written represent "0"s for convenience.

Again, a sub-array of array 700 corresponds to a word of program data. More specifically, individual rows of array 700 correspond to two bits of program data of a word (e.g., stored in a four-level MLC). Thus, eight rows of array 700 may correspond to sixteen bits (e.g., a word) of program data that may be encoded using array 700. Of course, particular numbers and other details used to describe array 700 are merely examples, and claimed subject matter is not so limited.

Thus, where a codeword includes 256 bits of program data, partitioned into sixteen words (e.g., consistently-sized groupings of bits), array 700 may include sixteen sub-arrays 710, 720, 730, and 740 (sub-arrays between 730 and 740 are not shown). In such a case, a word comprises sixteen bits. Individual sub-arrays of array 700 correspond to a sixteen bit word in this example, as stated above. To generate parity data for use in detecting and/or correcting errors for a 256-bit example (e.g., sixteen words stored in 128 MLC cells), three sub-arrays of array 700 include a corresponding non-zero column, with the column corresponding to a parity symbol. Thus, for example, individual sub-arrays 710 through 740 of array 700 include some corresponding non-zero columns.

Individual sub-arrays 710 through 740 may comprise eight rows and sixteen columns of "0"s, "1"s, "2"s, or "3"s. "1"s, "2"s, or "3"s in individual sub-arrays 710 through 740 may form an association between program data and parity data. Non-zero column intersections (e.g., corresponding columns) in sub-arrays of array 700 may therefore represent an association between a word of program data (e.g., having "word level" granularity) and parity symbols. Thus, in this example, by construction, a parity symbol that is permitted to toggle up to three times, for example, may be associated with three words of program data.

Array 700 may correspond to an implementation where a MLC cell capable of being programmed to one of four data states is used to store a parity symbol, as mentioned above. Array 700 may thus be used to generate parity data for program data at a word level of granularity. Program data may be changed one word at a time (e.g., one word change per program operation). By analogy, but also in contrast, array 600 provides an illustrations of bit level granularity changes in program data. It appears, therefore, that for a corresponding amount of program data, a greater number of MLCs may be involved in storing parity data corresponding to one-bit level granularity compared to storing parity data corresponding to one-word (e.g., 16-bit in this example) level granularity. It is noted, of course, that an array may be generated rather than stored for a particular embodiment.

Using array 700 for generating parity data, any particular parity symbol, which may be stored in a four-state MLC, may be permitted up to three state transitions. In the example of a codeword comprising sixteen 16-bit words, program (e.g., write) operations may store data one word at a time. For example, a first word (of the sixteen words of program data) may be programmed, after which a second word may be programmed, and so on. Of course, details of array 700 are merely examples, and claimed subject matter is not so limited.

Table 1 shows a number of cases with varying arrangements of program data (e.g., column C) and/or parity data (e.g., column B) for four-level MLCs, based at least in part, on a parity generator array. Of course, a parity generator array may comprise any form or structure, and claimed subject matter is not necessarily limited to a parity generator array comprising columns or rows. However, line 6 in column A may correspond to the example embodiment involving array 600 or in which parity data correspond to columns and program data correspond to rows. Column D shows a ratio of the number of parity symbols to program data bits. Column E, shows the number of MLC cells that may be used in an embodiment, such as embodiment 500, for example

TABLE 1

| A Line number | B Number of parity symbols | C Number of program data bits | D Array OH (%) | E Number of MLCs |
|---|---|---|---|---|
| 1 | 3 | 4 | 75.0 | 5 |
| 2 | 4 | 6 | 66.7 | 7 |
| 3 | 5 | 7 | 71.4 | 8.5 |
| 4 | 6 | 9 | 66.7 | 10.5 |
| 5 | 7 | 10 | 70.0 | 12 |
| 6 | 8 | 12 | 66.7 | 14 |
| 7 | 9 | 13 | 69.2 | 15.5 |
| 8 | 10 | 15 | 66.7 | 17.5 |
| 9 | 11 | 16 | 68.8 | 19 |
| 10 | 12 | 18 | 66.7 | 21 |
| 11 | 13 | 19 | 68.4 | 22.5 |
| 12 | 14 | 21 | 66.7 | 24.5 |
| 13 | 15 | 22 | 68.2 | 26 |
| 14 | 16 | 24 | 66.7 | 28 |
| 15 | 17 | 25 | 68.0 | 29.5 |
| 16 | 18 | 27 | 66.7 | 31.5 |
| 17 | 86 | 129 | 66.7 | 150.5 |
| 18 | 171 | 256 | 66.8 | 299 |

Figure 8:
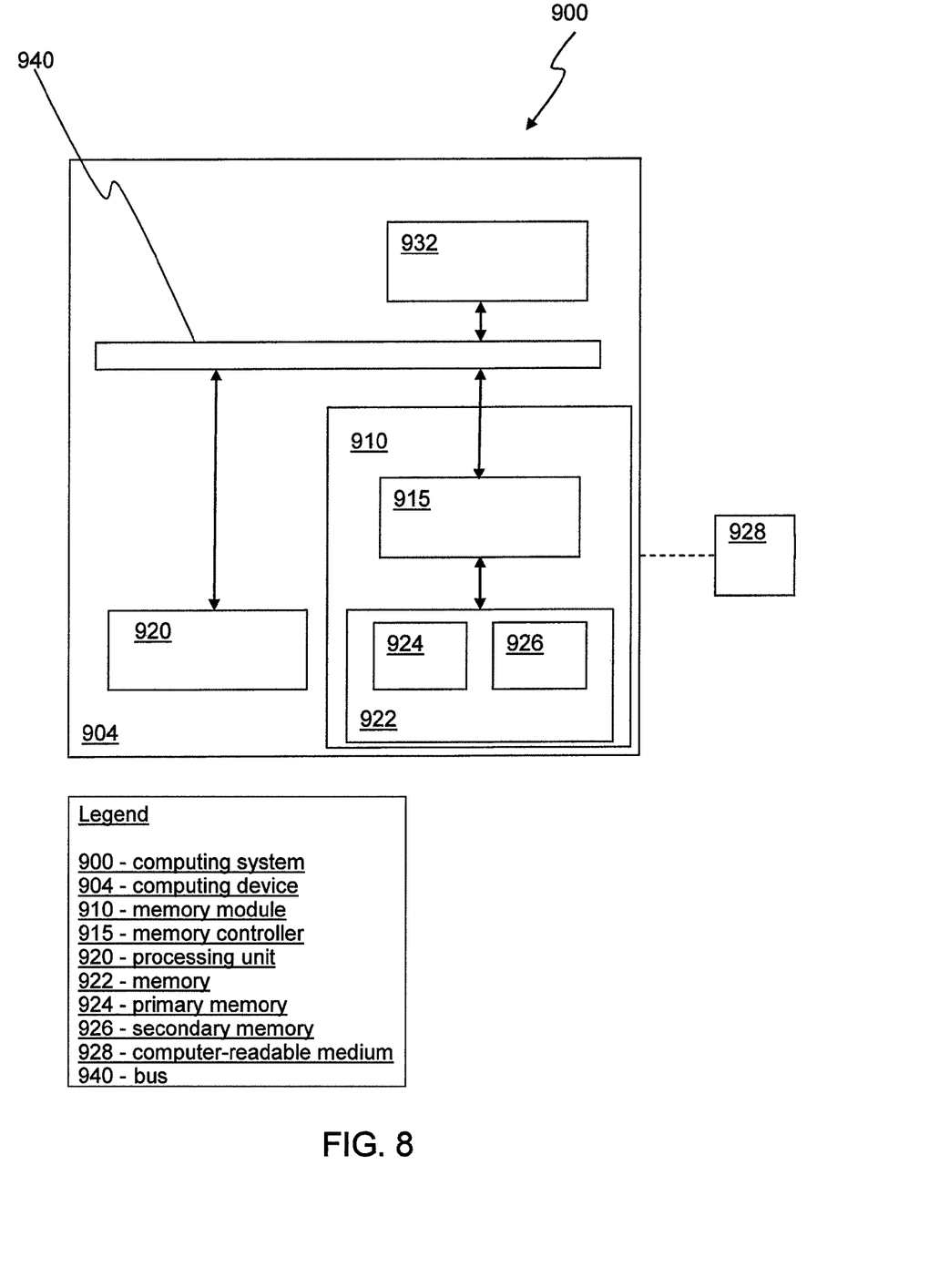
FIG. 8 is a schematic diagram illustrating an embodiment of a computing system.

FIG. 8 is a schematic diagram illustrating an embodiment of an apparatus in the form of a computing system 900 including a memory module 910 (which may also be considered an apparatus), which may comprise a multi-chip memory module including memory devices that are interconnected with one another in a chain topology, for example. A computing device may comprise one or more processors, for example, to execute an application or other code. A computing device 904 may be representative of any device, appliance, or machine that may be used to manage memory module 910. Memory module 910 may include a memory controller 915 and a memory 922. By way of example but not limitation, computing device 904 may include: one or more computing devices or platforms, such as, e.g., a desktop computer, a laptop computer, a workstation, a server device, or the like; one or more personal computing or communication devices or appliances, such as, e.g., a personal digital assistant, mobile communication device, or the like; a computing system or associated service provider capability, such as, e.g., a database or information storage service provider or system; or any combination thereof.

It is recognized that all or part of the various devices shown in system 900, and the processes and methods as further described herein, may be implemented using or otherwise including at least one of hardware, firmware, or software, other than software by itself. Thus, by way of example, but not limitation, computing device 904 may include at least one processing unit 920 that is operatively coupled to memory 922 through a bus 940 and a host or memory controller 915. Processing unit 920 is representative of one or more devices capable of performing at least a portion of a computing procedure or process. By way of example, but not limitation, processing unit 920 may include one or more processors, microprocessors, controllers, application specific integrated circuits, digital signal processors, programmable logic devices, field programmable gate arrays, and the like, or any combination thereof. Processing unit 920 may include an operating system to be executed that is capable of communication with memory controller 915. An operating system may, for example, generate commands to be sent to memory controller 915 over or via bus 940. Commands may comprise read or write commands, for example. In response to a write command, for example, memory controller 915 may perform process 800 described above, to program memory and to change parity data.

Memory 922 is representative of any information storage mechanism. Memory 922 may include, for example, a primary memory 924 or a secondary memory 926. Primary memory 924 may include, for example, a random access memory, read only memory, etc. While illustrated in this example as being separate from processing unit 920, it should be understood that all or part of primary memory 924 may be provided within or otherwise co-located or coupled with processing unit 920. In one implementation, memory 922 may be incorporated in an integrated circuit, for example, which may comprise a port to receive error syndromes or other error data from processing unit 920.

Secondary memory 926 may include, for example, the same or similar type of memory as primary memory or one or more other types of information storage devices or systems, such as a disk drive, an optical disc drive, a tape drive, a solid state memory drive, etc. In certain implementations, secondary memory 926 may be operatively receptive of, or otherwise capable of being operatively coupled to a computer-readable medium 928. Computer-readable medium 928 may include, for example, any medium that is able to store (e.g., carry or otherwise make accessible) readable, writable, or rewritable data (e.g., code or instructions) for one or more of device in system 900. Computing device 904 may include, for example, an input/output device or unit 932.

Input/output unit or device 932 is representative of one or more devices or features that may be capable of accepting or otherwise receiving signal inputs from a human or a machine, or one or more devices or features that may be capable of delivering or otherwise providing signal outputs to be received by a human or a machine. By way of example but not limitation, input/output device 932 may include a display, speaker, keyboard, mouse, trackball, touch screen, etc.

It will, of course, be understood that, although particular embodiments have just been described, claimed subject matter is not limited in scope to a particular embodiment or implementation. For example, one embodiment may be in hardware, such as implemented on a device or combination of devices. Likewise, although claimed subject matter is not limited in scope in this respect, one embodiment may comprise one or more articles, such as a storage medium or storage media that may have stored thereon instructions capable of being executed by a specific or special purpose system or apparatus, for example, to result in performance of an embodiment of a method in accordance with claimed subject matter, such as one of the embodiments previously described. However, claimed subject matter is, of course, not limited to one of the embodiments described necessarily. Furthermore, a specific or special purpose computing platform may include one or more processing units or processors, one or more input/output devices, such as a display, a keyboard or a mouse, or one or more memories, such as static random access memory, dynamic random access memory, flash memory, or a hard drive, although, again, claimed subject matter is not limited in scope to this example.

In some circumstances, operation of a memory device, such as a change in data state, for example, may comprise a transformation, such as a physical transformation. With particular types of memory devices, such a physical transformation may comprise a physical transformation of an article to a different state or thing. For example, but without limitation, for some types of memory devices, a change in data state may involve an accumulation and storage of charge or a release of stored charge. Likewise, in other memory devices, a change of data state may comprise a physical change or transformation in magnetic orientation or a physical change or transformation in molecular structure, such as from crystalline to amorphous or vice-versa. The foregoing is not intended to be an exhaustive list of all examples in which a change in data state in an apparatus such as a memory device may comprise a transformation, such as a physical transformation. Rather, the foregoing are intended as illustrative examples.

A storage medium typically may be non-transitory or comprise a non-transitory device. In this context, a non-transitory storage medium may include a device that is tangible, meaning that the device has a concrete physical form, although the device may change its physical state. Thus, for example, non-transitory refers to a device remaining tangible despite this change in state.

In the preceding description, various aspects of claimed subject matter have been described. For purposes of explanation, specific numbers, systems, or configurations may have been set forth to provide a thorough understanding of claimed subject matter. However, it should be apparent to one skilled in the art having the benefit of this disclosure that claimed subject matter may be practiced without those specific details. In other instances, features that would be understood by one of ordinary skill were omitted or simplified so as not to obscure claimed subject matter. While certain features have been illustrated or described herein, many modifications, substitutions, changes, or equivalents may now occur to those skilled in the art. It is, therefore, to be understood that the appended claims are intended to cover all such modifications or changes as fall within the true spirit of claimed subject matter.

What is claimed is:

1. A method comprising:
   storing codeword data, including program data and associated parity data, in a group of multi-level memory cells, wherein the storing the codeword data comprises:
      storing only a single bit of parity data per multi-level memory cell for storing the parity data, wherein no program data is stored in multi-level memory cells storing the associated parity data, wherein none of the multi-level memory cells of the group storing program data stores any parity data, and wherein each of the multi-level memory cells of the group storing program data stores more than one bit of program data;
      wherein the parity data are capable of being changed more than once without erasing corresponding memory cells of the group of memory cells;
   changing the program data stored in the multi-level memory cells of the group storing program data; and
   responsive to changing the program data, reprogramming the multi-level memory cells of the group storing the associated parity data prior to performing an erase operation on the multi-level memory cells storing the associated parity data.

2. The method of claim 1, wherein the group of memory cells comprises a block of memory cells.

3. The method of claim 1, wherein reprogramming the multi-level memory cells of the group storing the associated parity data further comprises changing the associated parity data prior to performing the erase operation on the multi-level memory cells storing the associated parity data.

4. A method comprising:
   generating one or more bits of parity data from program data so that a number of changes to a parity bit of the one or more parity bits is maintained below a threshold before performing an erase operation;
   storing parity data corresponding to the program data in a first group of multi-level memory cells, and storing the program data in a second group of multi-level memory cells, wherein no program data is stored in multi-level memory cells storing the parity data,
   wherein each of the multi-level memory cells of the first group stores only a single bit of parity data, wherein none of the multi-level memory cells of the second group storing program data stores any parity data, and wherein each of the multi-level memory cells of the second group storing program data stores more than one bit of program data;
   changing the program data stored in the second group of multi-level memory cells storing program data; and
   responsive to changing the program data, reprogramming the multi-level memory cells of the first group storing the associated parity data prior to performing an erase operation on the multi-level memory cells of the first group storing the associated parity data.

5. The method of claim 4, wherein generating one or more parity bits comprises generating one or more parity bits using a parity generator array.

6. An apparatus comprising:
   a group of multi-level memory cells configured to store program data and associated parity data, the group of multi-level memory cells comprising a first group configured to store only parity data and a second group configured to store only program data;
   wherein the apparatus is configured to store only a single bit of parity data per memory cell of the first group of multi-level memory cells,
   wherein the apparatus is configured to store no program data in the first group of multi-level memory cells storing the parity data,
   wherein each cell of the first group of multi-level memory cells is capable of allowing a parity bit stored in the cell to be changed more than once without erasing the cell;
   wherein none of the multi-level memory cells of the second group storing program data stores any parity data, and wherein each of the multi-level memory cells of the second group storing program data stores more than one bit of program data; and
   wherein the apparatus is configured to:
      change the program data stored in the second group of multi-level memory cells storing program data; and
      responsive to changing the program data, reprogram the multi-level memory cells of the first group storing the associated parity data prior to performing an erase operation on the multi-level memory cells of the first group storing the associated parity data.

7. The apparatus of claim 6, wherein the apparatus comprises at least one of the following: a memory device, a desktop computer, a laptop computer, a workstation, a server device, a personal digital assistant, a mobile communication device, or any combination thereof.

8. An apparatus comprising:
   memory programming circuitry to add electrical charge to a charge storage structure of a multi-level memory cell to change a value of parity bit multiple times before erasing the memory cell,
   wherein the apparatus is configured to store only a single bit of parity data in the multilevel memory cell,
   wherein the apparatus is configured to store no program data in the multi-level memory cell;
   wherein the parity bit is associated with program data stored in a group of multi-level memory cells storing program data, wherein none of the multi-level memory cells of the group storing program data stores any parity data, and wherein each of the multi-level memory cells of the group storing program data stores more than one digit of program data; and wherein the apparatus is configured to:
change the program data stored in the group of multi-level memory cells storing program data; and
responsive to changing the program data, reprogram the multi-level memory cell storing the parity bit prior to performing an erase operation on the multi-level memory cell storing the parity bit.

9. The apparatus of claim 8, wherein the multiple times corresponds to a number one less than a number of states to which the memory cell is able to be programmed.

10. The apparatus of claim 8, further comprising:
a port to receive externally generated parity data.

11. The apparatus of claim 8, wherein the memory cell comprises a memory cell in a NOR flash memory array.

12. An apparatus, comprising:
a first group of multi-level memory cells to store multiple digits of program data per memory cell; and
a second group of multi-level memory cells to store parity data associated with the program data, wherein the second group stores only a single parity digit per memory cell while storing no program data;

wherein the signal parity digit is capable of being changed more than once before executing an erase operation;

wherein none of the multi-level memory cells of the first group storing program data stores any parity data, and wherein each of the multi-level memory cells of the first group storing program data stores more than one digit of program data; and wherein the apparatus is configured to:
change the program data stored in the first group of multi-level memory cells storing program data; and
responsive to changing the program data, reprogram the multi-level memory cells of the second group storing the associated parity data prior to performing an erase operation on the multi-level memory cells of the second group storing the associated parity data.

13. The apparatus of claim 12, wherein the single parity digit comprises one bit.

\* \* \* \* \*